US012685029B2

(12) United States Patent
Chepulskyy et al.

(10) Patent No.: US 12,685,029 B2
(45) Date of Patent: Jul. 14, 2026

(54) SEMICONDUCTOR DEVICE AND METHOD OF MAKING THE SAME

(71) Applicant: Samsung Electronics Co., Ltd., Suwon-si (KR)

(72) Inventors: Roman Chepulskyy, Santa Clara, CA (US); Dmytro Apalkov, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 760 days.

(21) Appl. No.: 17/709,045

(22) Filed: Mar. 30, 2022

(65) Prior Publication Data

US 2023/0276714 A1     Aug. 31, 2023

Related U.S. Application Data

(60) Provisional application No. 63/314,048, filed on Feb. 25, 2022.

(51) Int. Cl.
| | |
|---|---|
| *H10N 50/80* | (2023.01) |
| *H10B 61/00* | (2023.01) |
| *H10N 50/01* | (2023.01) |
| *H10N 50/10* | (2023.01) |
| *H10N 50/85* | (2023.01) |
| *H10N 59/00* | (2026.01) |

(52) U.S. Cl.
CPC ............. *H10N 50/80* (2023.02); *H10B 61/00* (2023.02); *H10N 50/01* (2023.02); *H10N 50/10* (2023.02); *H10N 50/85* (2023.02); *H10N 59/00* (2023.02)

(58) Field of Classification Search
CPC ........ H10N 50/01; H10N 50/80; H10N 50/10; H10N 50/85; H10N 59/00; H10B 61/00
See application file for complete search history.

(56) References Cited

U.S. PATENT DOCUMENTS

| | | | |
|---|---|---|---|
| 7,848,065 B2 * | 12/2010 | Freitag | G01R 33/093 |
| | | | 360/324.12 |
| 8,692,342 B2 | 4/2014 | Oh et al. | |
| 9,006,704 B2 | 4/2015 | Jan et al. | |
| 9,147,833 B2 | 9/2015 | Pi et al. | |

(Continued)

FOREIGN PATENT DOCUMENTS

KR     10-2012-0130701 A     12/2012

OTHER PUBLICATIONS

Shen et al., "Improvement of Transport Properties in Magnetic Tunneling Junction by Capping Materials", IEEE Transactions on Magnetics, v.43, pp. 2785-2787 (2007) (Year: 2007).*

(Continued)

*Primary Examiner* — Britt Hanley
*Assistant Examiner* — Victor V Barzykin
(74) *Attorney, Agent, or Firm* — Womble Bond Dickinson (US) LLP

(57) ABSTRACT

A magnetic junction includes a free layer including iron (Fe), the free layer has a first planar surface and a first side surface crossing the first planar surface; a first cap layer on the first planar surface of the free layer; and a protection layer on the first cap layer, wherein the protection layer is 8 angstroms (Å) or less in thickness. The protection layer may include one or more elements selected from the group consisting of Ta, Rh, Nb, C, Os, Ir, W, Re, Si, Ru, Ti, and Pt.

21 Claims, 6 Drawing Sheets

(56) References Cited

U.S. PATENT DOCUMENTS

| | | | |
|---|---|---|---|
| 9,425,387 | B1 | 8/2016 | Liu et al. |
| 10,431,736 | B2 | 10/2019 | Liu et al. |
| 10,516,095 | B2 * | 12/2019 | Yamakawa ............ H10N 50/80 |
| 2014/0361391 | A1 | 12/2014 | Shen et al. |
| 2019/0198567 | A1 * | 6/2019 | Oguz ..................... H10N 50/01 |
| 2021/0320245 | A1 | 10/2021 | Kalitsov et al. |
| 2022/0148785 | A1 * | 5/2022 | Guo ....................... H10N 50/10 |

OTHER PUBLICATIONS

X.M. Wang et.al., "Phase Equilibria of the Fe—Mo—Ta Ternary system", J. Phase Equilib. Diffus., pp. 413-422 (Year: 2019).*
G. Kresse et al., Efficiency of ab-initio total energy calculations for metals and semiconductors using a plane-wave basis set, Computational Materials Science, 1996, pp. 15-50, vol. 6, Elsevier Science B.V.
G. Kresse et al., Efficient iterative schemes for ab initio total-energy calculations using a plane-wave basis set, Physical Review B, 1996, pp. 11169-11186, vol. 54, No. 16, The American Physical Society.
G. Kresse et al., From ultrasoft pseudopotentials to the projector augmented-wave method, Physical Review B, 1999, pp. 1758-1775, vol. 59, No. 3, The American Physical Society.
John P. Perdew et al., Generalized Gradient Approximation Made Simple, Physical Review Letters, 1996, pp. 3865-3868, vol. 77, No. 18, The American Physical Society.
Korean Office Action corresponding to KR Application No. 10-2023-0002706, dated Mar. 31, 2026 (7 pages).

* cited by examiner

FIG. 6

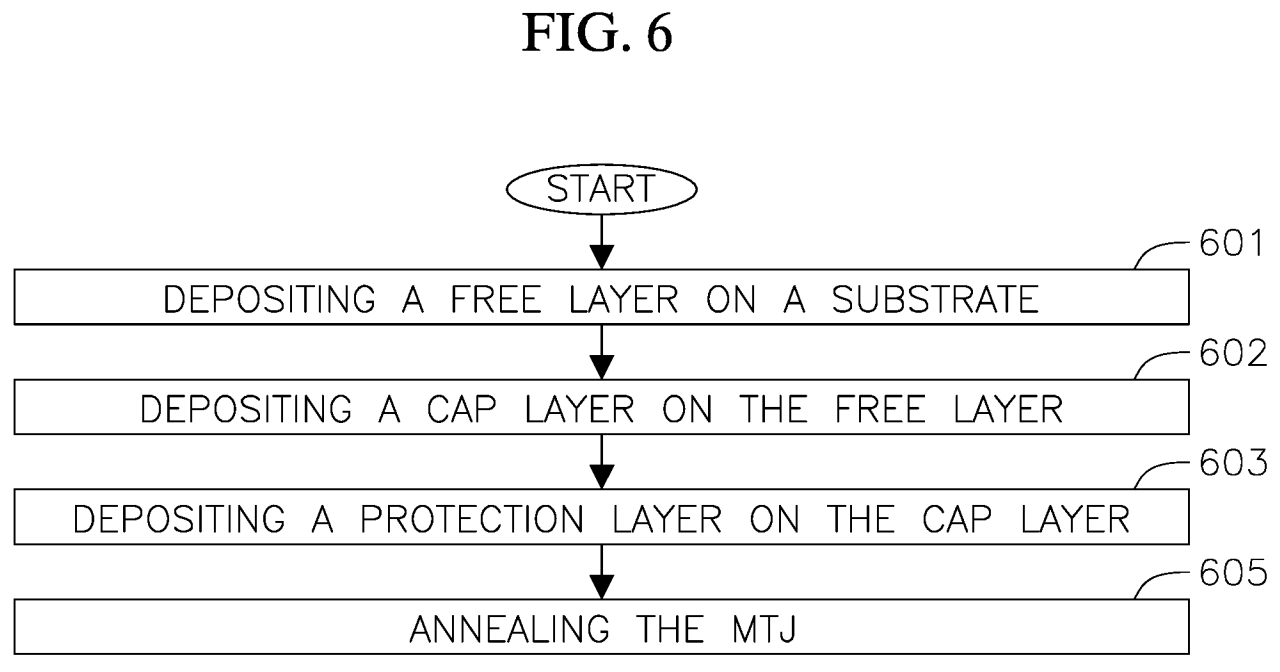

START

601 — DEPOSITING A FREE LAYER ON A SUBSTRATE

602 — DEPOSITING A CAP LAYER ON THE FREE LAYER

603 — DEPOSITING A PROTECTION LAYER ON THE CAP LAYER

605 — ANNEALING THE MTJ

SEMICONDUCTOR DEVICE AND METHOD OF MAKING THE SAME

CROSS-REFERENCE TO RELATED APPLICATION

The present application claims priority to and the benefit of U.S. Provisional Application No. 63/314,048, filed on Feb. 25, 2022, the entire content of which is incorporated herein by reference.

FIELD

The present disclosure relates generally to a semiconductor device, in particular, a magnetic junction with a protection layer, and a method of making the same.

BACKGROUND

Magnetic memories, particularly magnetic random-access memories (MRAMs), have the potential for high read/write speed, high endurance, non-volatility (e.g., persistence), and low power consumption. An MRAM can store information utilizing magnetic materials as an information recording medium. One type of MRAM is a spin-transfer-torque magnetic random-access memory (STT-MRAM). STT-MRAM utilizes magnetic tunnel junctions (MTJs) written at least in part by a current driven through the magnetic junction, which has a tunneling barrier stacked between a free layer and a reference layer. The current affects the magnetic moment of the free layer to be either aligned or anti-aligned with the magnetic moment of the reference layer (which is unaffected by the current). As the alignment of magnetic moments remains unchanged in the absence of the charge current, the MTJ stack behaves as a bi-stable system suitable for memory storage.

The MTJ may further include a cap layer formed of a metal oxide, such as MgO. During subsequent processing steps, the elements of the cap layer may migrate to the side surfaces of the free layer and/or reference layer, and penetrate into these layers to cause deterioration of the important characteristics of the free layer and/or reference layer, such as tunneling magneto-resistance (TMR), perpendicular magnetic anisotropy (PMA), exchange stiffness constant (Aex), damping characteristics, etc., which may lower the effectiveness of the MRAM.

The above information disclosed in this Background section is only for enhancement of understanding of the background of the invention and therefore it may contain information that does not constitute prior art.

SUMMARY

An aspect according to embodiments of the present disclosure is directed toward a magnetic junction with improved tunnel magnetoresistance (TMR), perpendicular magnetic anisotropy (PMA), exchange stiffness constant (Aex), damping characteristics, saturation magnetization (Ms), etc.

Another aspect according to embodiments of the present disclosure is directed toward a method of forming the magnetic junction.

According to one or more embodiments of the present disclosure, a magnetic junction includes a free layer having a first planar surface and a first side surface crossing the first planar surface; a first cap layer on the first planar surface of the free layer; and a protection layer on the first cap layer, wherein the protection layer is 8 angstroms (Å) or less in thickness.

In an embodiment, the protection layer is 1 to 3 angstroms (Å) in thickness.

In an embodiment, the protection layer includes one or more elements selected from the group consisting of Ta, Rh, Nb, C, Os, Ir, W, Re, Si, Ru, Ti, and Pt.

In an embodiment, the protection layer includes one or more elements selected from the group consisting of Ta, Rh, Nb, and C.

In an embodiment, the first cap layer includes MgO, TaO, HfO, ZrO, or AlOx.

In an embodiment, the magnetic junction further includes a second cap layer between the first cap layer and the protection layer, wherein the second cap layer is 1 to 8 angstroms (Å) in thickness.

In an embodiment, the second cap layer includes Mg or Ti.

In an embodiment, the magnetic junction further includes a reference layer between the free layer and the first cap layer.

In an embodiment, the first cap layer includes Mg or Ti.

In an embodiment, the first cap layer is 1 to 8 angstroms (Å) in thickness.

According to one or more embodiments of the present disclosure, a magnetoresistive random-access memory (MRAM) includes the magnetic junction.

According to one or more embodiments of the present disclosure, a magnetic junction includes a free layer having a first planar surface and a first side surface crossing the first planar surface; a first cap layer on the first planar surface of the free layer; and a side protection layer on the first side surface of the free layer, wherein the side protection layer includes one or more elements selected from the group consisting of Ta, Rh, Nb, C, Os, Ir, W, Re, Si, Ru, Ti, and Pt.

In an embodiment, the magnetic junction further includes a protection layer on the first cap layer, wherein the protection layer has the same composition as the side protection layer.

In an embodiment, the protection layer is 1 to 3 angstroms (Å) in thickness.

In an embodiment, the magnetic junction further includes a second cap layer between the first cap layer and the protection layer, wherein the second cap layer includes Mg or Ti.

In an embodiment, the first cap layer includes MgO, TaO, HfO, ZrO, or AlOx.

According to one or more embodiments of the present disclosure, a method of manufacturing a magnetic junction includes: depositing a free layer, the free layer having a first planar surface and a first side surface crossing the first planar surface; depositing a first cap layer on the first planar surface of the free layer; and depositing a protection layer on the first cap layer, wherein the protection layer is 8 angstroms (Å) or less in thickness.

In an embodiment, the free layer includes iron (Fe).

In an embodiment, the method further includes annealing the magnetic junction after the depositing of the protection layer.

In an embodiment, the depositing of the protection layer is conducted after the depositing of the first cap layer without an annealing act therebetween.

In an embodiment, the protection layer includes an element selected from the group consisting of Ta, Rh, Nb, C, Os, Ir, W, Re, Si, Ru, Ti, and Pt.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and enhancements of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 6 is a flow chart showing a process of manufacturing a magnetic junction.

DETAILED DESCRIPTION

Figure 1:
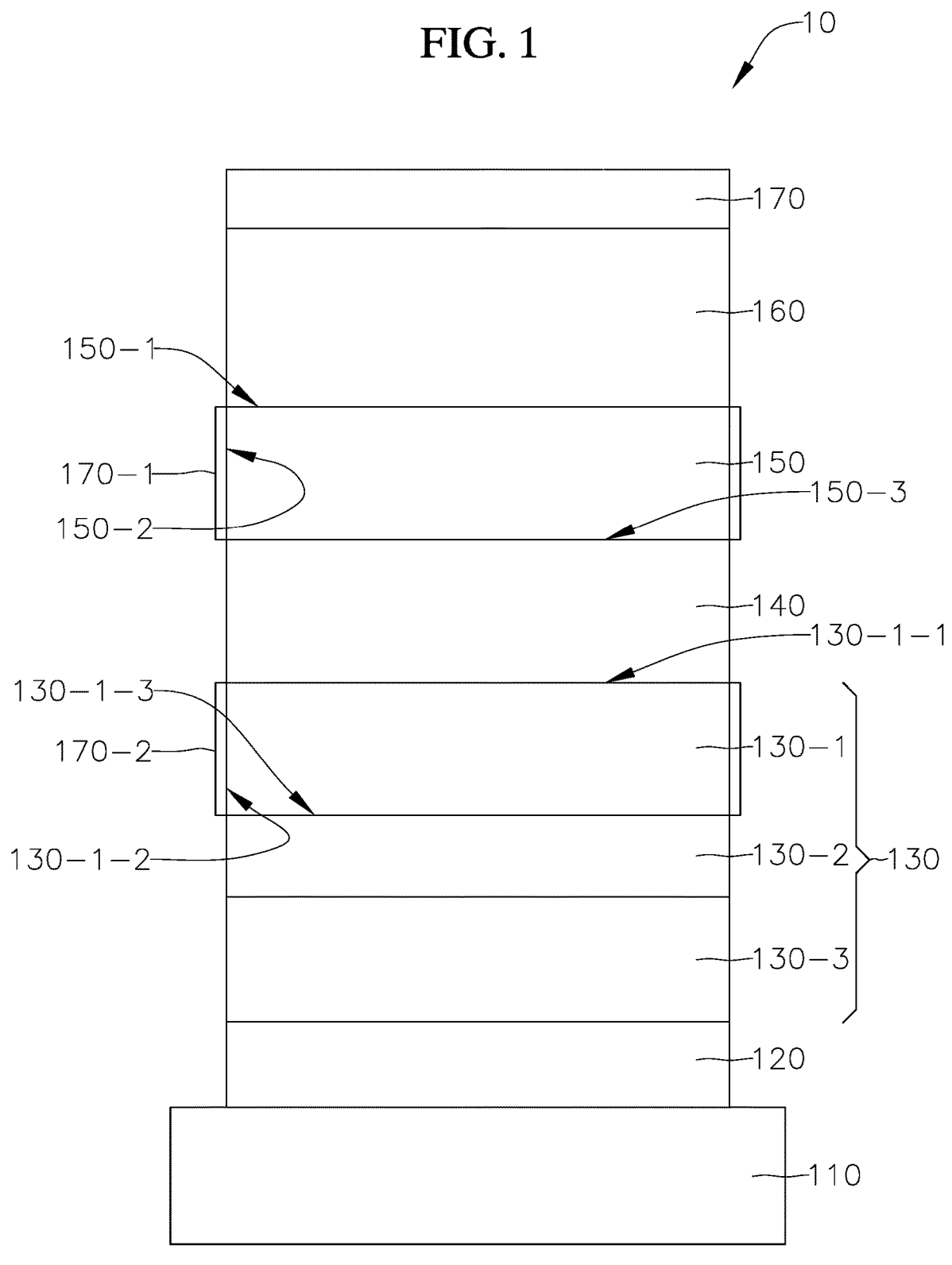
FIG. 1 is a schematic illustration of a magnetic junction according to an embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein.

Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The example embodiments are described in the context of particular magnetic junctions and magnetic memories having certain components. One of ordinary skill in the art will readily recognize that embodiments of the present invention are consistent with the use of magnetic junctions and magnetic memories having other and/or additional components and/or other features not inconsistent with embodiments of the present invention. The method and system are also described in the context of current understanding of spin-orbit interaction, the spin transfer phenomenon, of magnetic anisotropy, and other physical phenomena. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the methods and systems described herein are not dependent upon a particular physical explanation. One of ordinary skill in the art will also readily recognize that the methods and systems are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit interaction active layers, and/or other structures having particular layers. However, one of ordinary skill in the art will readily recognize that magnetic junctions, spin-orbit interaction active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

According to one or more embodiments of the present disclosure, a magnetic junction includes a free layer, the free layer has a first planar surface and a first side surface crossing (e.g., at an angle greater than 0 degree and less than 180 degrees, e.g., perpendicular, to) the first planar surface; a first cap layer on the first planar surface of the free layer; and a protection layer on the first cap layer, wherein the protection layer is 8 angstroms (Å) or less in thickness.

FIG. 1 is a schematic illustration of a magnetic junction 10 according to an embodiment of the present disclosure.

Referring to FIG. 1, a magnetic junction 10 may include a reference layer 130; a tunneling barrier layer 140; a free layer 150; a cap layer 160; and a protection layer 170. In some embodiments, the magnetic junction 10 may further include a substrate 110 and/or a seed layer 120 on the substrate 110. In some embodiments, a top contact and a bottom contact may be respectively formed over the top and bottom of the magnetic junction 10 to drive current through the magnetic junction 10 in a current-perpendicular-to-plane (CPP) direction.

The seed layer 120 may be formed from one or more of Ta, Ru, Ir, CoFeB, CoFeBTa, CoFeBRu, magnesium oxide (MgO), TaO, HfO, ZrO, Mg/Ir, Mg/Ru, and Mg/Re. In some embodiments, the seed layer 120 may have a single layer structure or a stacked structure of two or more layers. The seed layer(s) may be utilized to tailor the properties of the free layer 150 and/or the reference layer 130.

In some embodiments, the reference layer 130 may include a stacked structure including a top reference layer 130-1, a spacer layer 130-2, and a bottom reference layer 130-3. In some embodiments, the spacer layer 130-2 may be an RKKY spacer layer to provide the (RKKY) Ruderman-Kittel-Kasuya-Yosida interaction, which antiferromagnetically couples the magnetizations of the top and bottom reference layers 130-1 and 130-3. The top reference layer 130-1 may include cobalt-iron (CoFe), cobalt-iron-boron (CoFeB), cobalt-iron-hafnium (CoFeHf), cobalt-iron-zirconium (CoFeZr), cobalt-nickel (CoNi), cobalt palladium (CoPd), cobalt iridium (CoIr), cobalt platinum (CoPt), or in alloy form of various compositions or a multilayer (e.g. $[Co/Pt]_N$, where N is a number from 1 to 30). The spacer layer 130-2 may include Ru, Rh, Ir, or an alloy or multilayer of these (e.g. RuRh), and may be about 3 angstroms to about 16 angstroms thick. The bottom reference layer 130-3 may include a multilayer or alloy such CoPt, CoPd, CoIr, $[Co/Pt]_N$, $[Co/Pd]_N$, $[Co/Ir]_N$, where N is a number from 1 to 30.

In some embodiments, the reference layer 130 may have a high perpendicular magnetic anisotropy. That is, the perpendicular magnetic anisotropy energy exceeds the out-of-plane demagnetization energy for the reference layer 130. Such a configuration allows for the magnetic moment(s) of the reference layer 130 to be stable perpendicular to plane or in another direction that may be close to perpendicular to plane. Thus, the magnetic moment(s) of the reference layer 130 are stable out-of-plane. In an alternate embodiment, the magnetic moments of the layer 130 may be stable in-plane. In some embodiments, the reference layer 130 may be a high perpendicular anisotropy (Hk) multilayer(s). In addition, in alternate embodiments, the reference layer 130 may have the magnetic moment in plane.

The tunneling barrier layer 140 may include MgO, for example, crystalline MgO. In other embodiments, the tunneling barrier layer 140 may include MgAlO of various compositions. In some embodiments, the tunneling barrier layer 140 may have a thickness that is about 1.5 nm or less, for example, about 1 nm or less. The tunneling barrier layer 140 may enhance TMR of the magnetic junction 10.

The free layer 150 may include a ferromagnetic or ferrimagnetic material. In some embodiments, the free layer 150 may include a magnetic material (e.g., Fe, Co, Ni, and/or Mn of various suitable compositions), or a magnetic material with non-magnetic dilutions (e.g. B, Ta, Hf, Mg, Ge, etc.). In some embodiments, the free layer 150 may be an iron (Fe) containing layer. In one embodiment, the free layer may include one or more layers, each including iron boron (FeB), FeB-X, iron cobalt boron (FeCoB), FeCoB-X, iron (Fe), Fe-X, iron cobalt (FeCo), and/or FeCo-X, where X is selected from beryllium (Be), nickel (Ni), molybdenum (Mo), magnesium (Mg), zirconium (Zr), tantalum (Ta), vanadium (V), chromium (Cr), tungsten (W), hafnium (Hf), niobium (Nb), and terbium (Tb). For example, the free layer 150 may include iron cobalt boron/iron (FeCoB/Fe), cobalt iron boron (Co—Fe—B) of various suitable compositions, etc. In some embodiments, the free layer 150 may be an iron-free free layer including materials such as cobalt boron (Co—B). The magnetic junction 10 is configured to allow the free layer magnetic moment to be switched between stable magnetic states utilizing a write current passed through the magnetic junction 10. Thus, the free layer 150 is switchable utilizing spin transfer torque when a write current is driven through the magnetic junction 10 in a current perpendicular-to-plane (CPP) direction. The direction of the magnetic moments of the free layer 150 may be read by driving a read current through the magnetic junction 10. The free layer 150 may include a first planar surface 150-1, a second planar surface 150-3 facing the first planar surface 150-1, and a first side surface 150-2 crossing the first and second planar surfaces 150-1 and 150-3.

The cap layer 160 may include a metal oxide, such as MgO, TaO, HfO, ZrO, etc. The cap layer 160 may have a thickness of about 4 to 14 angstroms, and may be utilized to tailor the properties of the free layer 150 and/or the reference layer 130.

The protection layer 170 may have a thickness of about 8 angstroms (Å) or less. In an embodiment, the protection layer 170 may be 1 to 3 angstroms (Å) or 1 to 2 angstroms (Å) in thickness. The protection layer 170 may include one or more elements that may have high affinity to the materials of the free layer 150 and/or reference layer 130, and may migrate to a side surface of the free layer 150 and/or reference layer 130 to protect the free layer 150 and/or reference layer 130 from being contaminated by elements contained in the cap layer 160.

The materials for forming the protection layer 170 are selected to include elements with a suitable affinity (i.e., higher adsorption energy) to the material comprised in the free layer 150 (e.g., Fe), suitable diffusion stability at the interface with the free layer 150 (e.g., less prone to diffuse into the free layer), and/or having low impact on the properties of the free layer 150 even after diffusion into the free layer 150.

Figure 2:
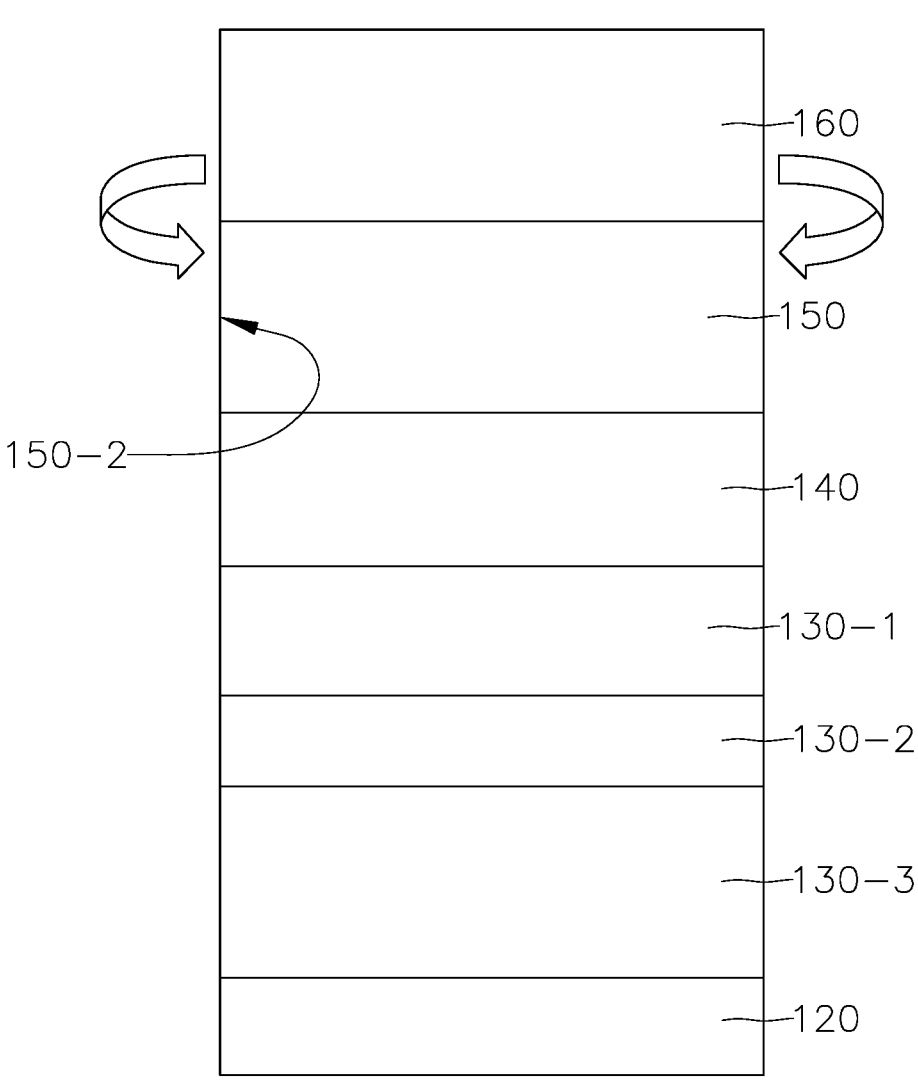
FIG. 2 is a schematic illustration of the migration of elements from a cap layer to the side surface of a free layer during deposition and/or annealing process.

In a device without the protection layer 170 as shown in FIG. 2, during deposition and/or annealing process, some elements of the cap layer 160, e.g., oxygen (O), hafnium (Hf), zirconium (Zr), etc., may migrate to the first side surface 150-2 of the free layer 150 due to attraction between these elements and materials and/or elements of the free layer 150, such as iron (Fe). Subsequently, these elements from the cap layer 160 may penetrate the first side surface 150-2 into the free layer 150 and contaminate the free layer 150. Due to the contamination, desirable or crucial characteristics of the free layer, such as tunneling magnetoresistance (TMR), perpendicular magnetic anisotropy (PMA), exchange stiffness constant (Aex), damping characteristics, etc., may be deteriorated. As a result, the effectiveness of an MRAM device including the magnetic junction may deteriorate.

Figure 3:
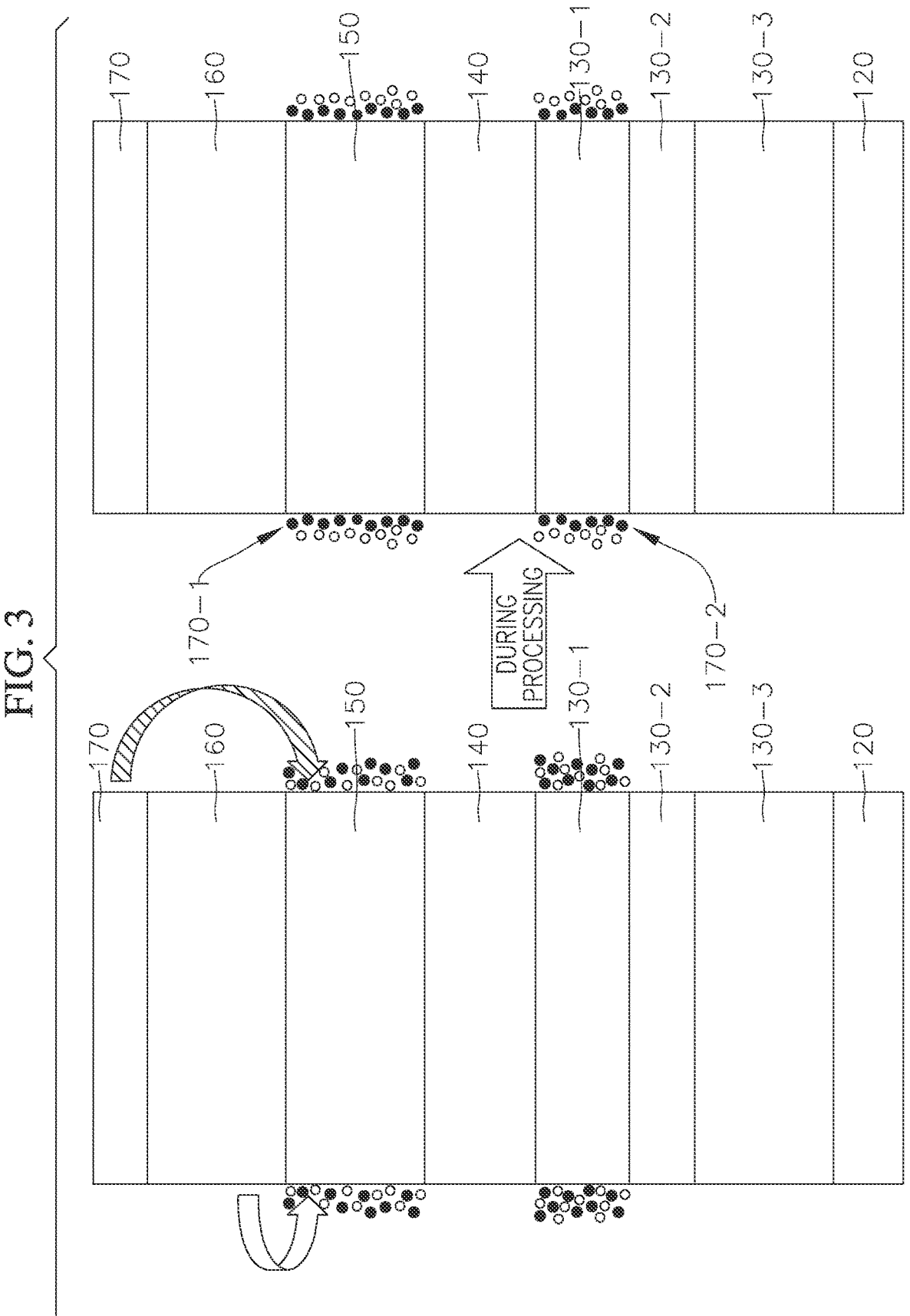
FIG. 3 is a schematic illustration of the migration of elements from a cap layer and a protection layer to a side surface of a free layer during deposition and/or annealing process according to an embodiment of the present disclosure.

The magnetic junction 10 according to embodiments of the present disclosure includes the protection layer 170. As illustrated schematically in FIG. 3, during deposition and/or annealing, the elements from the protection layer 170 may migrate to the side surfaces (e.g., the first side surface 150-2) of the free layer 150 along with elements from the cap layer 160. The elements of the protection layer 170 then forms a side protection layer 170-1 between the first side surface 150-2 of the free layer 150 and elements from the cap layer 160 that migrated to the first side surface 150-2 of the free layer 150 due to its higher affinity to the free layer 150 than elements from the cap layer 160. Here, the elements of the protection layer 170 migrated to the first side surface 150-2 of the free layer 150 act to cover the first side surface 150-2 of the free layer 150 and protect the free layer 150 from contamination by elements from the cap layer 160.

In some embodiments, the elements of the protection layer 170 may have a suitable attraction to the free layer 150. In an embodiment, the elements of the protection layer 170 may have a high affinity towards iron. The elements of the protection layer 170 may migrate to the side surfaces and form a barrier layer at the side surfaces (e.g., the first side surface 150-2) of the free layer 150 to prevent or reduce diffusion of elements of the cap layer 160 into the free layer 150.

In an embodiment, the reference layer 130 has a first planar surface 130-1-1, a second planar surface 130-1-3, and a first side surface 130-1-2 crossing the first and second planar surface 130-1-1 and 130-1-3. Here, the first planar surface 130-1-1 of the reference layer 130 faces towards the second planar surface 150-3 of the free layer 150. The magnetic junction 10 may further include a second side protection layer 170-2 on the first side surface 130-1-2 of the reference layer 130.

In some embodiments, the element(s) of the protection layer 170 may have a suitable attraction to the reference layer 130. In an embodiment, the elements of the protection layer 170 may have a high affinity towards the material of the top reference layer 130-1 and/or the bottom reference layer 130-3. The elements of the protection layer 170 migrate to the side surfaces and form a second side protection layer 170-2 at the side surfaces of the top reference layer 130-1 and/or the bottom reference layer 130-3 to prevent or reduce diffusion of elements of the cap layer into the reference layer 130.

In an embodiment, the first side protection layer 170-1 may have the same composition as the protection layer 170. In an embodiment, the second side protection layer 170-2 may have the same composition as the protection layer 170. In an embodiment, the magnetic junction 10 may include both the first side protection layer 170-1 and the second side protection layer 170-2.

The affinity between an element and a material layer may be calculated using an ab initio method. For example, the affinity may be represented by the adsorption energy Ea between an element and a material layer. For example, the elements with the highest affinity to the free layer (e.g., Fe containing free layer) based on calculations include C, Ta, B, Ir, N, Os, W, O, Hf, Nb, Zr, Pt, etc.

In addition to the affinity to the free layer, the elements with the highest diffusion stability in the free layer (e.g., in Fe) include Os, Ta, Ir, W, V, Re, Si, Rh, Ru, Cr, Mn, Ti, Mo, Pt, Nb, etc., which show higher resistance to substitutional diffusion through vacancies into the free layer. On the other hand, Zr and Hf can easily diffuse into the free layer with barely any resistance. Other elements that show low diffusion stability and may easily diffuse into the free layer include Sc, Te, Li, Sb, Zn, Ga, etc.

Some smaller elements may diffuse into the free layer through interstitial diffusion, such as C, B, N, etc. Among these elements, C, B, and N show higher resistance to interstitial diffusion into the free layer, while H, Li, He, Be and O may easily diffuse into the free layer.

Combining the affinity to the free layer and the diffusion stability, elements such as Os, Ta, Ir, W, Re, Si, Rh, Ru, Ti, Pt, Nb, C, B and/or N have both suitable affinity for the free layer and suitable diffusion stability. As such, these elements may be easily attracted to the side surface of the free layer during deposition/annealing processes, but may form a stable interface layer with the free layer without diffusing into the free layer to cause any significant deterioration in the properties of the free layer. In fact, even if added (e.g., diffused) into the free layer, it was discovered by the present inventors that elements such as Ta, Rh, Nb and C do not cause significant deterioration in the properties of the free layer. Furthermore, due to the formation of this stable interface layer, elements from the cap layer is blocked from diffusing into the free layer. On the other hand, elements such as Co, Hf, Zr and/or O may be easily attracted to the side surface of the free layer during deposition/annealing processes, but may also easily diffuse into the free layer. Among those, Hf, Zr and O, when diffused into the free layer, may cause significant deterioration in the properties of the free layer. Other elements, such as Co, have been shown to not cause significant deterioration in the properties of the free layer even after diffusion into the free layer.

In an embodiment, the protection layer includes one or more elements (e.g., in the elemental form and can migrate freely without breaking any chemical bonds) selected from the group consisting of Ta, Rh, Nb, C, Os, Ir, W, Re, Si, Ru, Ti, and Pt. In an embodiment, a metal in the protection layer may be in the elemental metal form and may not be oxidized, e.g., a Ta layer, a Rh layer, etc. In an embodiment, the protection layer includes one or more elements selected from the group consisting of Ta, Rh, Nb, and C. In an embodiment, the protection layer consists of one or more elements selected from the group consisting of Ta, Rh, Nb, C, Os, Ir, W, Re, Si, Ru, Ti, and Pt.

Referring to FIG. 1, in one or more embodiments, the elements of the protection layer 170 may migrate to and cover the first side surface 150-2 of the free layer. The elements of the protection layer 170 may form a first side protection layer 170-1 on the first side surface 150-2 of the free layer 150.

Figure 4:
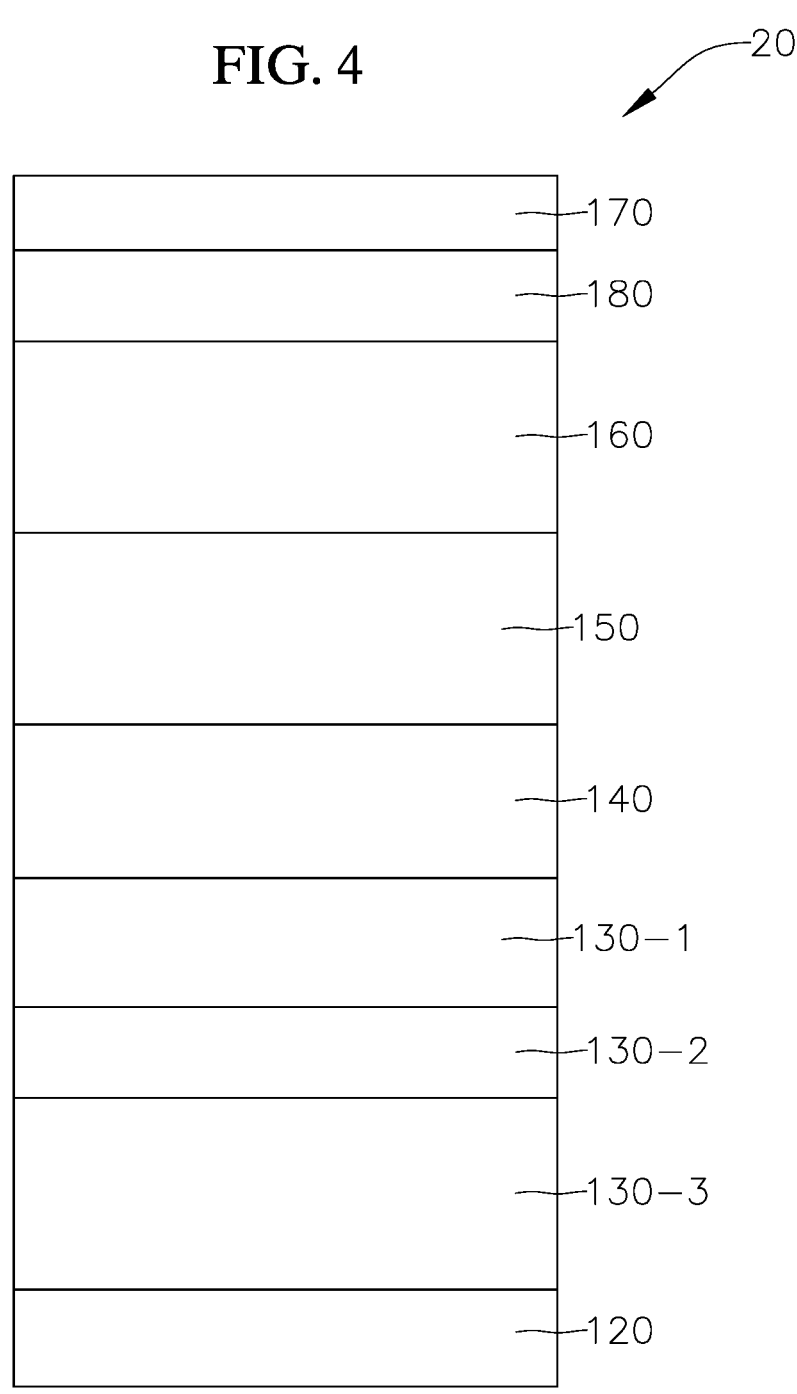
FIG. 4 is a schematic illustration of a magnetic junction according to an embodiment of the present disclosure.

FIG. 4 shows a magnetic junction 20 according to one or more embodiments of the present disclosure. The magnetic junction 20 shown in FIG. 4 is similar to the one shown in FIG. 1, except for having a second cap layer 180 between the first cap layer 160 and the protection layer 170, and descriptions of the same components are not repeated.

Referring to FIG. 4, the second cap layer 180 may include a lighter element than the element included in the protection layer 170. In some embodiments, the second cap layer 180 may include Mg and/or Ti. In some embodiments, the element of the second cap layer 180 may be partially oxidized. In some embodiments, the second cap layer 180 may be 1 to 8 angstroms in thickness, for example, 1 to 5 angstroms in thickness.

The second cap layer 180 may reduce or prevent damage to the first cap layer 160 (e.g., an oxide cap layer) by the relatively heavier elements of the protection layer 170. Partial oxidation of the second cap layer 180 may enhance bonding of elements in the second cap layer 180 and prevent or reduce diffusion of the elements of the second cap layer 180 into the first cap layer 160.

In an embodiment, when Ti is utilized to form the protection layer 170, the second cap layer 180 may not be included. In an embodiment, the protection layer 170 formed of Ti may be 1 to 8 angstroms (Å) in thickness, for example, 1 to 5 angstroms or 1 to 2 angstroms (Å) in thickness.

Figure 5:
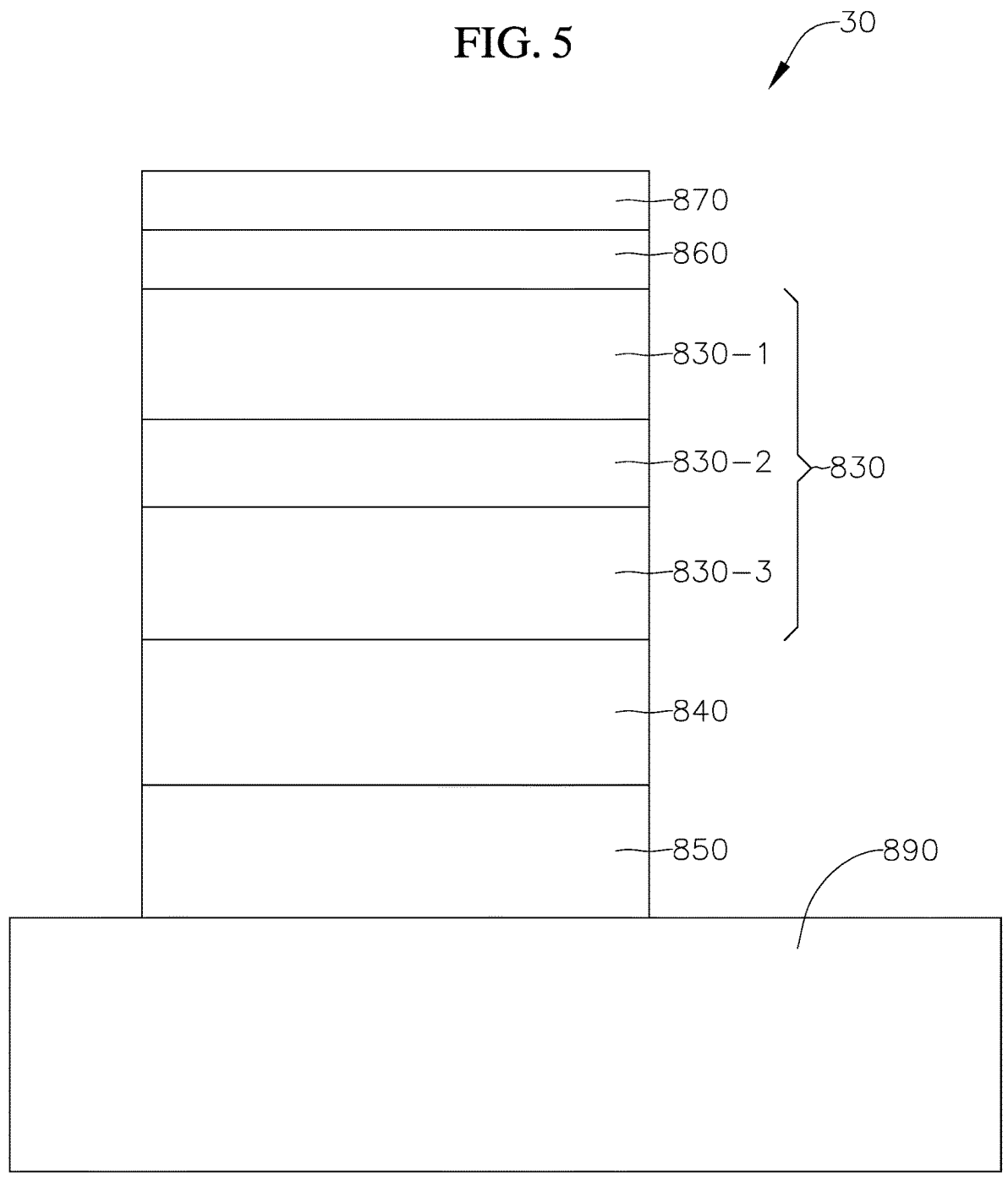
FIG. 5 is a schematic illustration of a magnetic junction according to an embodiment of the present disclosure.

FIG. 5 shows a magnetic junction 30 according to one or more embodiments of the present disclosure. The magnetic junction 30 shown in FIG. 5 is a bottom-free-layer MTJ (BMTJ). Referring to FIG. 5, the BMTJ 30 includes a spin-orbit torque (SOT) line 890, a free layer 850 on the SOT line, a tunneling barrier layer 840 on the free layer 850, a reference layer 830 on the tunneling barrier layer 840, a cap layer 860 on the reference layer 830, and a protection layer 870 on the cap layer 860. In some embodiments, the reference layer 830 may include a bottom reference layer 830-3, an RKKY spacer layer 830-2, and a top reference layer 830-1, sequentially stacked over the tunneling barrier layer 840 in the stated order. The free layer 850, the tunneling barrier layer 840, the reference layer 830, and the protection layer 870 are substantially the same as the free layer 150, the tunneling barrier layer 140, the reference layer 130, and the protection layer 170 described in connection with FIG. 1, and detailed descriptions thereof are not repeated.

Referring to FIG. 5, the cap layer 860 may include a lighter element than the element included in the protection layer 870. In some embodiments, the cap layer 860 may include Mg and/or Ti. In some embodiments, the element of the cap layer 860 may be partially oxidized. In some embodiments, the cap layer 860 may be 1 to 8 angstroms in thickness, for example, 1 to 5 angstroms in thickness.

The cap layer 860 may reduce or prevent damage to the top reference layer 830-1 by the relatively heavier elements of the protection layer 870. Partial oxidation of the cap layer 860 may enhance bonding of elements in the cap layer 860 and prevent or reduce diffusion of the elements of the cap layer 860 into the top reference layer 830-1.

In an embodiment, Ti is utilized to form the protection layer 870, and the cap layer 860 may not be included. In an embodiment, the protection layer 870 formed of Ti may be 1 to 8 angstroms (Å) in thickness, for example, 1 to 5 or 1 to 3 angstroms in thickness.

While example free layer (e.g., Fe-containing free layer) has been described in detail to explain embodiments of the present disclosure, the present disclosure is not limited thereto. The free layer may include any suitable materials.

According to an embodiment of the present disclosure, a method of manufacturing a magnetic junction includes depositing a free layer on a substrate, the free layer having a first planar surface and a first side surface crossing the first planar surface; depositing a first cap layer on the first planar surface of the free layer; and depositing a protection layer on the first cap layer, wherein the protection layer is 8 angstroms (Å) or less in thickness.

FIG. 6 is a flow chart illustrating a method of manufacturing a magnetic junction according to embodiments of the present disclosure. Referring to FIG. 6, the method includes depositing a free layer on a substrate in act 601, depositing a cap layer on the free layer in act 602, and depositing a protection layer on the cap layer in act 603. In an embodiment, a cooling and/or an annealing act may be conducted between adjacent depositing acts (e.g., between act 601 and act 602, between act 603 and act 603, etc.). The free layer may include a ferromagnetic or ferrimagnetic material (e.g., iron (Fe)) and have a first planar surface and a first side surface crossing the first planar surface. The first cap layer may be deposited on the first planar surface of the free layer. The protection layer may be 8 angstroms (Å) or less in thickness.

In an embodiment, the protection layer may be 5 angstroms (Å) or less in thickness, for example, may be 1 to 3 angstroms (Å) in thickness.

In an embodiment, the protection layer may be formed by depositing one or more elements selected from the group consisting of Ta, Rh, Nb, C, Os, Ir, W, Re, Si, Ru, Ti, and Pt.

In an embodiment, the depositing of the protection layer may be conducted after the depositing of the first cap layer without an annealing act therebetween.

In an embodiment, the first cap layer comprises MgO, TaO, HfO, ZrO, or AlOx.

In an embodiment, the method may further include annealing the magnetic junction and/or additional deposition of material layers after the deposition of the protection layer in act 605. During deposition and/or annealing in act 605, the elements from the protection layer may migrate to the side surfaces of the free layer. The elements of the protection layer then forms a side protection layer between the side surfaces of the free layer and elements from the cap layer that also migrated to the side surfaces of the free layer. Here, the elements of the protection layer may have higher affinity to the free layer than the elements of the cap layer, and therefore forms a barrier layer between the elements of the cap layer and the free layer. That is, elements of the protection layer migrate to the side surfaces of the free layer act to cover the side surfaces of the free layer and protect the free layer from contamination by elements from the cap layer.

In an embodiment, the method may further include depositing a second cap layer on the first cap layer prior to the depositing of the protection layer, wherein the second cap layer is 1 to 8 angstroms (Å) in thickness.

In an embodiment, the second cap layer may include Mg or Ti.

In an embodiment, the method may further include depositing a seed layer on the substrate, depositing a reference layer on the seed layer, and depositing a tunneling barrier layer on the reference layer prior to the depositing of the free layer.

Hereinafter, materials and magnetic junctions according to embodiments will be described in more detail with reference to the following examples and comparative examples.

EXAMPLES

Comparative Example 1

An MgO cap layer is deposited over an iron layer (e.g., free layer) to form the structure of MgO/Fe without a protection layer.

Example 1

Ta is used for forming protection layer over a free layer including Fe. An MgO cap layer is formed over Ta to form the structure of MgO/Ta/Fe, with Ta between the MgO layer and the Fe layer. The properties of the free layer including PMA, TMR stability (spin filtering effect) of the bulk free layer, TMR stability (spin filtering effect) of the aMgO, spin polarization with concentration c of Ta at c=0.5 in the bulk free layer, spin polarization with concentration c of Ta at c=0.5 of aMgO, MgO lattice match (represented by % of dilution to Fe to achieve full lattice match between Fe and MgO), segregation to MgO (represented by % of atoms segregated at the Fe/MgO interface at 25° C.), magnetic exchange stiffness Aex % change at 12.5% dilution of the respective element in Fe in comparison to pure Fe, and magnetic moment Ms % change at 12.5% dilution of the respective element in Fe in comparison to pure Fe, and diffusion energy Eb were obtained utilizing ab initio calculations. The calculations were performed utilizing the pseudopotential momentum-space total energy and force formalism within the plane-augmented-wave method in PBE DFT-GGA approximation. Details of the calculations method are disclosed by J. P. Perdew, K. Burke, and M. Ernzerhof (Phys. Rev. Lett. 77, 3865 (1996)) as implemented by the VASP program package (see G. Kresse and J. Furthm"uller, Comput. Mater. Sci. 6, 15 (1996); Phys. Rev. B 54, 11169 (1996); and G. Kresse and D. Joubert, Phys. Rev. B 59, 1758 (1999)), the disclosures of all of which are incorporated herein by reference in their entireties.

The differences between calculation results of Example 1 and that of Comparative Example 1 are listed in Table 1.

Examples 2 to 3

Examples 2 to 3 were manufactured and characterized similarly to Example 1, except for utilizing Rh and Nb respectively for forming the protection layer over the free layer including Fe.

Comparative Examples 1-3

Comparative Examples 1-3 were manufactured and characterized similarly to Example 1, except for utilizing Co, Zr, and Hf respectively for forming the protection layer over the free layer including Fe.

Table 1 lists the properties calculated for each of Examples 1-3 and Comparative Examples 1-3.

TABLE 1

| | | Comparative Examples | | | Examples | | |
|---|---|---|---|---|---|---|---|
| | | 1 Co | 2 Zr | 3 Hf | 1 Ta | 2 Rh | 3 Nb |
| PMA | erg/cm2 | 1.2 | 1.5 | 1.5 | 4 | 2.7 | 1.6 |
| TMR stability (Bulk) | d, eV | 0.7 | 0.1 | 0 | 0.2 | -0.69 | 0.1 |
| TMR stability (aMgO) | d, eV | 0.5 | N/A | N/A | 0.6 | -0.28 | 0.6 |
| Spin Polarization c = 0.5 | Bulk, % | 60 | 70 | 55 | 70 | 80 | 66 |
| Spin Polarization c = 0.5 | aMgO, % | 71 | N/A | N/A | 64 | 81 | 57 |
| MgO Lattice Match | % of dilution to perfect match | no change | 18 | 21 | 30 | 40 | 30 |
| Segregation to MgO | % of segregated atoms at 25 C. | 31 | 78 | 48 | 5 | 43 | 21 |

TABLE 1-continued

| | | Comparative Examples | | | Examples | | |
|---|---|---|---|---|---|---|---|
| | | 1 Co | 2 Zr | 3 Hf | 1 Ta | 2 Rh | 3 Nb |
| Aex % change | at 12.5% dilution | 26 | −2 | −4 | 8 | −3 | 5 |
| Ms % change | at 12.5% dilution | 4 | −25 | −25 | −24 | −2 | −24 |
| Diffusion Eb | eV | 0.8 | 0.4 | 0.1 | 0.4 | 0.9 | 0.2 |

Each of the properties shown in Table 1 represents change in the respective property as a result of adding the elements to the Fe-based free layer (e.g., Fe layer). By way of example, the PMA, TMR stability, spin polarization values are changes caused by the addition of the respective elements in the Fe layer. With respect to MgO lattice match, pure Fe has 3% lattice mismatch with MgO, which may produce imperfect crystal structure at the Fe/MgO interface during sputtering. When Zr is utilized, 18 atomic % (at %) of Zr dilution of Fe (with a composition of $Fe_{82}Zr_{18}$) is needed to achieve a full lattice match between the Fe-based free layer and MgO. That is, adding 18 at % of Zr to Fe reduces the lattice mismatch between the free layer and MgO to zero. With respect to segregation to MgO, for example, when Zr is utilized, 78% of the total Zr content in the Fe-based free layer will segregate at the Fe/MgO interface at 25° C. With respect to the magnetic exchange stiffness Aex, when 12.5 at % of Co is added into Fe ($Fe_{87.5}Co_{12.5}$), Aex increases by 26% in comparison to pure Fe. With respect to the magnetic moment Ms, when 12.5 at % of Zr is added into Fe ($Fe_{87.5}Zr_{12.5}$), Ms drops by 25% in comparison to pure Fe.

It can be observed from Table 1 that Ta, Rh, and Nb each have high affinity to the iron-containing free layer, but do not penetrate into the free layer or do not lead to significant deterioration of the characteristics of the free layer even if these elements penetrated into the iron-containing free layer. The devices of Examples 1 to 3 each have suitable or improved PMA, TMR, Aex and/or Ms compared to that of a device without the protection layer.

On the other hand, Co, Hf, and Zr all have high affinity to the iron-containing free layer, and also easily penetrate into the free layer. Among those, Hf, and Zr each caused significant deterioration in the performance properties of the free layer. Co, on the other hand, does not appear to cause significant deterioration of the performance properties of the free layer even when diffused into the free layer.

In some embodiments, a magnetic junction includes a protective layer according to one or more embodiments of the present disclosure may have improved free layer properties, such as having an improved PMA, TMA, Aex and/or Ms that are two times or higher than that of a corresponding magnetic junction without the protective layer.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims, and equivalents thereof.

What is claimed is:

1. A magnetic junction comprising:
a free layer having a first planar surface and a first side surface crossing the first planar surface;
a first cap layer on the first planar surface of the free layer;
a protection layer on the first cap layer; and
a side protection layer on the first side surface of the free layer,
wherein an element of the side protection layer has a higher affinity to the free layer than an element of the first cap layer, and
wherein the element of the side protection layer is directly on the first side surface of the free layer.

2. The magnetic junction of claim 1, wherein the protection layer is 1 to 3 angstroms (Å) in thickness.

3. The magnetic junction of claim 1, wherein the protection layer comprises one or more elements selected from the group consisting of Ta, Rh, Nb, C, Os, Ir, W, Re, Si, Ru, Ti, and Pt.

4. The magnetic junction of claim 1, wherein the protection layer comprises one or more elements selected from the group consisting of Ta, Rh, Nb, and C.

5. The magnetic junction of claim 1, wherein the first cap layer comprises MgO, TaO, HfO, ZrO, or AlOx.

6. The magnetic junction of claim 1, further comprising a second cap layer between the first cap layer and the protection layer,
wherein the second cap layer is 1 to 8 angstroms (Å) in thickness.

7. The magnetic junction of claim 6, wherein the second cap layer comprises Mg or Ti.

8. The magnetic junction of claim 1, further comprising a reference layer between the free layer and the first cap layer.

9. The magnetic junction of claim 8, wherein the first cap layer comprises Mg or Ti.

10. The magnetic junction of claim 8, wherein the first cap layer is 1 to 8 angstroms (Å) in thickness.

11. A magnetoresistive random-access memory (MRAM) comprising the magnetic junction of claim 1.

12. A magnetic junction comprising:
a free layer having a first planar surface and a first side surface crossing the first planar surface;
a first cap layer on the first planar surface of the free layer; and
a side protection layer directly on the first side surface of the free layer,
wherein the side protection layer comprises one or more elements in an elemental form selected from the group consisting of Ta, Rh, Nb, C, Os, Ir, W, Re, Si, Ru, Ti, and Pt, and
the one or more elements of the side protection layer have a higher affinity to the free layer than an element of the first cap layer.

13. The magnetic junction of claim 12, further comprising a protection layer on the first cap layer, wherein the protection layer has the same composition as the side protection layer.

14. The magnetic junction of claim 13, wherein the protection layer is 1 to 3 angstroms (Å) in thickness.

15. The magnetic junction of claim 13, further comprising a second cap layer between the first cap layer and the protection layer, wherein the second cap layer comprises Mg or Ti.

16. The magnetic junction of claim 12, wherein the first cap layer comprises MgO, TaO, HfO, ZrO, or AlOx.

17. The magnetic junction of claim 1, wherein the protection layer is 8 angstroms (Å) or less in thickness.

18. A method of manufacturing a magnetic junction, the method comprising:

depositing a free layer, the free layer having a first planar surface and a first side surface crossing the first planar surface;

depositing a first cap layer on the first planar surface of the free layer; and depositing a protection layer on the first cap layer, wherein the protection layer is 8 angstroms (Å) or less in thickness, and wherein an element of the protection layer has a higher affinity to the free layer than an element of the first cap layer and is directly on the first side surface of the free layer.

19. The method of claim 18, wherein the free layer comprises iron (Fe).

20. The method of claim 18, further comprising annealing the magnetic junction after the depositing of the protection layer.

21. The method of claim 18, wherein the protection layer comprises an element selected from the group consisting of Ta, Rh, Nb, C, Os, Ir, W, Re, Si, Ru, Ti, and Pt.

\* \* \* \* \*